(12) United States Patent
Cobbley et al.

(10) Patent No.: US 6,269,742 B1
(45) Date of Patent: *Aug. 7, 2001

(54) METHOD AND STENCIL FOR EXTRUDING MATERIAL ON A SUBSTRATE

(75) Inventors: Chad Cobbley, Boise; Ford B. Grigg, Meridian, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/572,738

(22) Filed: May 17, 2000

Related U.S. Application Data

(63) Continuation of application No. 09/030,047, filed on Feb. 24, 1998, now Pat. No. 6,089,151.

(51) Int. Cl.⁷ .................................................. B41N 1/24
(52) U.S. Cl. ........................................... 101/127; 101/129
(58) Field of Search .................................. 101/114, 127, 101/128.21, 128.4, 129

(56) References Cited

U.S. PATENT DOCUMENTS

| | | | |
|---|---|---|---|
| 4,280,888 | 7/1981 | Bush et al. | 204/159.15 |
| 5,359,928 | 11/1994 | Blessington et al. | 101/128.4 |
| 5,361,695 | 11/1994 | Takagi et al. | 101/127 |
| 5,373,786 | 12/1994 | Umaba | 101/127 |
| 5,460,316 | 10/1995 | Hefele | 101/127 |
| 5,478,699 | 12/1995 | Blessington et al. | 101/127 |
| 5,553,538 | 9/1996 | Freitag | 101/123 |
| 5,623,872 | 4/1997 | Tomomatsu | 101/129 |
| 5,658,827 | 8/1997 | Aulicino et al. | 228/180.22 |
| 5,669,970 | 9/1997 | Balog et al. | 118/213 |
| 5,672,542 | 9/1997 | Schwiebert et al. | 437/183 |
| 5,922,496 | * 7/1999 | Dalal et al. | 101/127 |

FOREIGN PATENT DOCUMENTS

| | | | |
|---|---|---|---|
| 75192 | 3/1991 | (JP) | 101/127 |
| 144191 | 5/1992 | (JP) | 101/128.4 |

* cited by examiner

*Primary Examiner*—Stephen R. Funk
(74) *Attorney, Agent, or Firm*—TraskBritt

(57) ABSTRACT

A stencil for use in fabricating semiconductor devices is disclosed that has an aperture having a first portion extending from a first side thereof and a second portion extending from a second side thereof to minimize the shear stress between the material extruded therethrough and the stencil. The stencil allows for material to be extruded through the top of the stencil to the surface of the substrate and not contact the wall of the second portion of the aperture of the stencil. Since the material only contacts a small area of the first portion of the aperture near the top of the stencil, the material remains on the substrate and not in the aperture of the stencil.

19 Claims, 3 Drawing Sheets

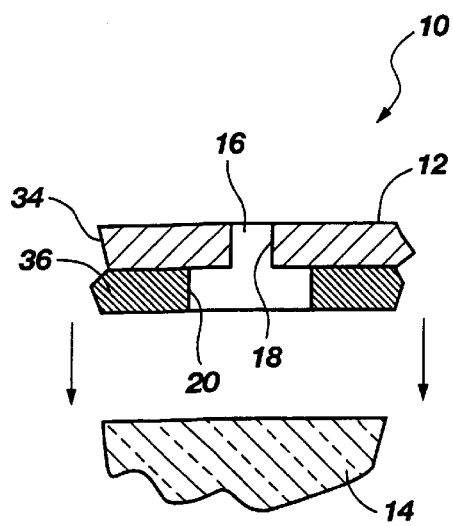
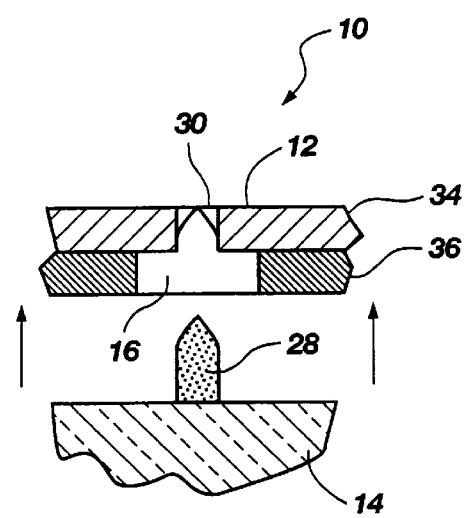
Fig. 7     Fig. 8
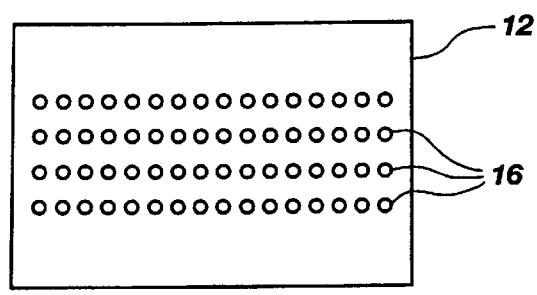
Fig. 9

METHOD AND STENCIL FOR EXTRUDING
MATERIAL ON A SUBSTRATE

CROSS-REFERENCE TO RELATED
APPLICATION

This application is a continuation of application Ser. No. 09/030,047, filed Feb. 24, 1998, now U.S. Pat. No. 6,089,151, issued Jul. 18, 2000.

BACKGROUND OF THE INVENTION

1. Field of the Invention

The present invention relates generally to applying a predetermined volume of material to a predetermined location on a substrate and, more particularly, to the use of a stencil having apertures that minimize the shear stress of a material applied using the stencil to a substrate.

2. State of the Art

The use of screen printing stencils is well known in the art. Screen printing stencils are used in a wide variety of applications in the electronic substrate fabrication and electronic assembly industry for applying materials such as photo resist or solder paste.

As the size of the features of a semiconductor device continues to decrease with each generation, ever greater precision is required in order to apply viscous material to the surface thereof. This includes the application of solder paste to the surface of a printed circuit board or die for securing a flip chip thereto. Metal stencils are currently utilized to apply the solder paste onto the surface for connecting the contact pads of surface mounted flip chips. These stencils typically have a plurality of apertures that is formed in the stencil in predetermined locations that corresponds to the pattern of the contact pads on the printed circuit board of choice.

In use, these stencils are positioned near or on the surface of the printed circuit board, the apertures in the stencil are aligned over the contact pads upon which the solder paste is to be applied, the solder paste is then urged mechanically through the apertures via a wiper, and the stencil is removed, leaving small islands of solder paste remaining on the contact pads of the printed circuit board.

One problem associated with the use of stencils is that an uneven, or varying, amount of solder may be placed across the contact pads of the printed circuit board. This adds to a lack of planarity across the printed circuit board contact pads which may cause a subsequent rework operation. Further, excess solder paste can be applied that results either in shorting or bridging between adjacent contact pads on the printed circuit board.

Another problem associated with the use of stencils is that the ratio of the height of the material to area occupied by the material is limited by the release of the material from apertures of the stencil. This material release is a function of the cohesive forces within the material and the cohesive forces between the material and stencil. As the size of the aperture dimensions decreases, the base cross-sectional area of the aperture decreases; however, it is still desirable to keep the material being applied through the aperture in the stencil at the same vertical size or height, or greater. Further, such material applied through the apertures of the stencil must be placed very close together. Unfortunately, current technology requires that as the vertical size or height increases, the base cross-sectional area of an aperture of the stencil must increase as well for release of the material applied through the apertures. This limits the pitch or spacing of the apertures in the stencil.

One prior art solution to this problem has been to taper the wall of an aperture in the stencil so that the aperture is wider or has a larger cross-sectional base area on the substrate side to provide an improved release of the material from the aperture. Unfortunately, since the taper of the aperture in the stencil is small with the aperture wall being substantially vertical, thereby providing a small increase in the cross-sectional base area of the aperture located adjacent the substrate, the material applied through the aperture can be pulled away from the substrate when the stencil is removed, thus resulting in the same problem as before.

U.S. Pat. No. 5,359,928, issued Nov. 1, 1994, discloses a screen printing stencil that has raised edges surrounding the apertures. The apertures also include tapered edges that provide a larger area at the portion of the stencil surface adjacent the substrate.

U.S. Pat. No. 5,460,316, issued Oct. 24, 1995, also discloses the use of stencils and apertures with tapered walls. The apertures having tapered walls provide a larger cross-sectional base area of the aperture adjacent the substrate than at the cross-sectional area at the opening or top of the aperture into which the solder paste is applied to the stencil. In both references, the larger cross-sectional base area of the aperture in the stencil is provided to reduce the amount of solder paste pulled away when the stencil is removed; however, the stencils require a larger cross-sectional base area for increased height or thickness of the solder pasted being applied through the aperture to the substrate.

Accordingly, it would be advantageous to overcome the problems inherent in the prior art solutions of using stencils while retaining sufficient material applied to the substrate upon removing the stencil in order to manufacture increased height or thicknesses of material applied through the apertures in the stencil while facilitating a reduced pitch or spacing of the apertures in the stencil.

BRIEF SUMMARY OF THE INVENTION

The present invention is directed to a stencil for use in applying material to semiconductor devices during the fabrication thereof. The stencil of the present invention includes apertures having a portion formed by a first wall extending from a first side of the stencil and a portion formed by a second wall extending from the second side of the stencil to minimize the shear stress between the stencil and the material being applied to the semiconductor device. The stencil allows material to be extruded through the portion formed by the first wall of each aperture of the stencil to the surface of the semiconductor device without contacting the wall of the second portion of the aperture of the stencil. Since the material only contacts a small area of the portion formed by the first wall of the aperture in the stencil, substantially all the material applied through the aperture remains on the semiconductor device and not in the aperture of the stencil.

BRIEF DESCRIPTION OF THE SEVERAL
VIEWS OF THE DRAWING

FIG. 7 is a schematic diagram of yet another alternative stencil of the present invention formed of multiple layers;

FIG. 8 is a schematic diagram of the stencil of FIG. 7 after applying material;

FIG. 9 is a top plan view of a stencil according to the present invention where a plurality of apertures is displayed;

DETAILED DESCRIPTION OF THE INVENTION

Figure 1:
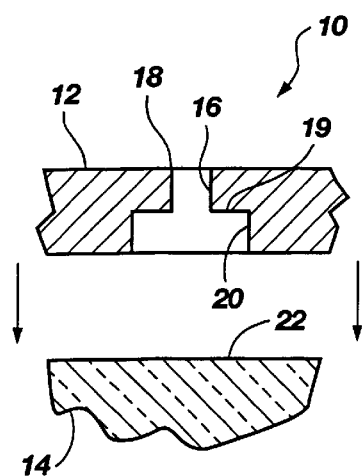
FIG. 1 depicts a schematic diagram of a stencil aperture according to the present invention.

FIG. 1 is a schematic diagram illustrating a portion of a manufacturing apparatus 10 used for applying material to the features of a semiconductor device. As illustrated, a stencil 12 is placed upon a substrate 14. FIGS. 1–4 schematically illustrate, in diagram form, a series of steps for applying a material to substrate 14 through the stencil 12 where the material is extruded through apertures 16 located in stencil 12. Corresponding elements of the apparatus 10 and stencil 12 are used throughout the several views of the present invention described herein.

Stencil 12 includes a plurality of apertures 16 formed therethrough. Stencil 12 may be formed from any suitable material, such as, for example, stainless steel, nickel, a substrate metal plated with a second metal, a nickel alloy, plastics, or other resins. Each aperture 16 of the stencil 12 includes a first portion formed by first wall 18 extending from the top surface of stencil 12 thereinto and a second portion formed by second wall 20 extending thereinto from the bottom surface of stencil 12 terminating in annular shoulder 19 located between the first wall 18 and the second wall 20. The second wall 20 forms a second portion of the aperture 16 through stencil 12 that is larger in cross-sectional area than the cross-sectional area of the first portion of the aperture 16 formed by the first wall 18.

Figure 2:
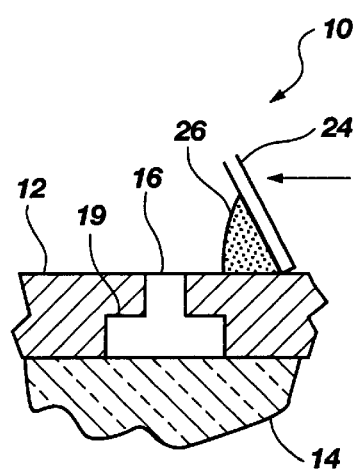
FIG. 2 depicts a schematic diagram of the stencil aperture of FIG. 1 as material is applied.
Figure 3:
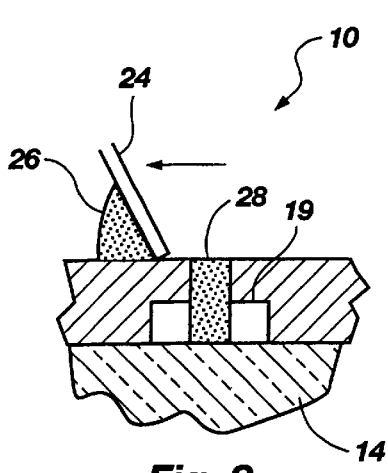
FIG. 3 depicts a schematic diagram of the next step of applying material to the underlying substrate through the stencil of FIG. 1.

In FIG. 2, once the stencil 12 is placed upon substrate 14 of a semiconductor device, a material 26 is applied across the top surface of stencil 12 via a wiper 24. The material 26 extrudes through the first portion of aperture 16 being constrained by first wall 18 and further extrudes through the second portion of the aperture 16, not contacting the second wall 20 thereof. As illustrated, material 26 contacts surface 22 of substrate 14, having an area substantially the same shape as formed by first wall 18. The extruded material 26 only contacts the first wall 18 of the aperture 16 of the stencil in a small area adjacent the top or upper end of the first portion formed by first wall 18 of aperture 16. Illustrated in FIG. 3 is the extruded material remaining on the substrate 14 as an element 28 of material.

Figure 4:
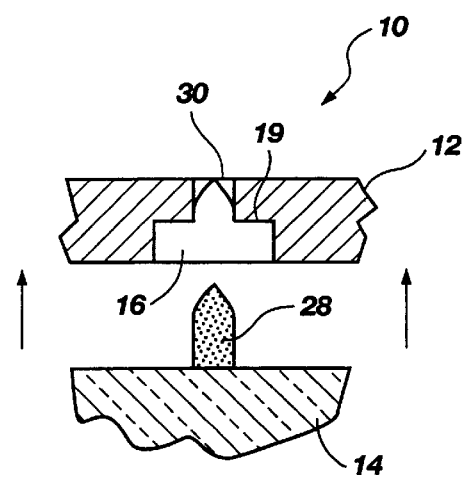
FIG. 4 is a schematic diagram of the final step of applying material to the substrate through the stencil of FIG. 1.

Next, stencil 12 is removed from the surface of substrate 14, leaving material element 28 that comprises substantially all of the material 26 extruded, or printed, through aperture 16. As schematically illustrated in FIG. 4, a small amount of the material 26 remains as excess material 30 at the top of the first portion formed by first wall 18 of the aperture 16 of stencil 12. Extruding material 26 through aperture 16 having a larger cross-sectional base area of the second portion formed by second wall 20 helps minimize the shear stress that is present between the material 26 and the walls 18 and 20 of the aperture 16 of the stencil 12, which is in clear contrast to the prior art where no such substantially larger cross-sectional base area of the aperture of the stencil is found.

The cross-sectional area of the second portion formed by second wall 20 of aperture 16 ranges from 1.1 to 10 times the cross-sectional area of the first portion formed by the first wall 18 of the aperture 16. The ratio of cross-sectional area of the second portion formed by second wall 20 to the cross-sectional area of the first portion formed by first wall 18 of the aperture 16 should not be so large as to allow deflection of the stencil 12 in the area of the aperture 16 when the wiper 24 presses downwardly across the surface of stencil 12. Further, the use of the second portion formed by second wall 20 having a substantially larger cross-sectional area than the cross-sectional area of the first portion formed by first wall 18 allows the extruded material forming element 28 to have a vertical height substantially equal to twice the nominal diameter of the material element 28 at the base thereof, or greater, depending upon the viscosity of the material 26 and the slump of such material 26 after the removal of the stencil 12.

The apertures 16 formed by walls 18 and 20 may have any desired overall shape or each portion may have any desired shape, such as square, circular, oval, rectangular, other polygonal shapes or combinations thereof. The aperture 16 and the portions thereof formed by walls 18 and 20 each have a nominal diameter. The height or thickness of the material element 28 is typically greater than the nominal diameter thereof, but can also be substantially the same height and nominal diameter. The ratio of vertical height to the nominal diameter of the material element 28 at the base thereof ranges from 0.1 to 10. This range translates to from 0.001" to 0.050" in height and from 0.0011" to 0.5" in diameter. The thickness of the stencil 12 ranges from 0.1 to 10 times the nominal diameter of the aperture 16 adjacent the top surface of the stencil 12 in forming material element 28. This range of height to nominal diameter ratios is achievable only because of the ability to extrude or apply the material as disclosed and illustrated herein, rather than is done in the prior art methods using other stencils. What limits the ratio of the element height versus the diameter at the base of the material element 28 is the viscosity of the material 26, as well as its thixotropic index. Thixotropic, highly viscous materials are used that have a viscosity typically ranging from 30K to 310K centipoise with approximately 70K centipoise being preferred. The thixotropic index typically ranges from 1.7–3.2, with approximately 2.5 being preferred.

During the formation of material elements 28, a release agent can be applied to the under-surface of stencil 12 and/or the apertures 16 to further enhance the release of material 26 therefrom.

Figure 5:
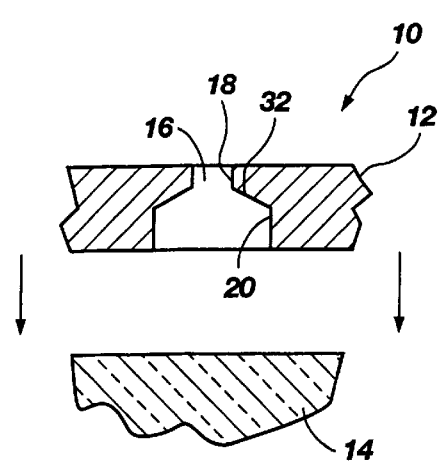
FIG. 5 is a schematic diagram of an alternative stencil aperture.
Figure 6:
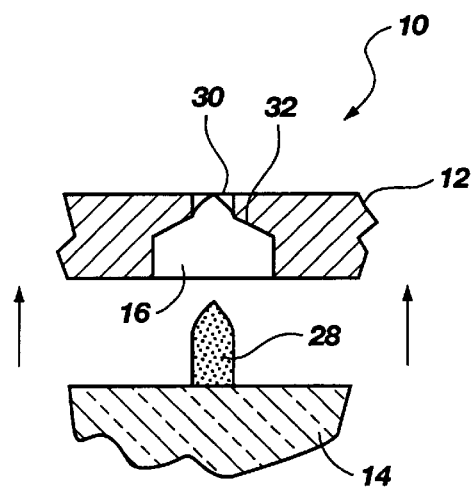
FIG. 6 is a schematic diagram of the stencil aperture of FIG. 5 after applying material.

Other embodiments of stencil 12 are possible. Alternative embodiments are illustrated in FIGS. 5–8. FIGS. 5 and 6 illustrate a stencil that has a sloped (frustoconical) shoulder 32 located between the first wall 18 and the second wall 20. The slope of the shoulder 32 can be either acute or obtuse, curved, or indented, or any suitable desired shape. Stencil 12 is again placed upon the surface of substrate 14. After material 26 is extruded through aperture 16, material element 28 remains after removal of the stencil 12 from substrate 14.

Yet another embodiment of stencil 12 is illustrated in FIGS. 7 and 8. FIG. 7 illustrates a stencil 12 being formed in multiple layers 34,36, thereby having formed therein first and second walls 18 and 20, respectively, of an aperture 16. The first layer 34 forms the first portion of each aperture 16 by way of first wall 18 therein. Next, a second layer 36, applied to the bottom of first layer 34, forms the second portion of aperture 16 by way of second wall 20 therein. Second layer 36 forms second portions of aperture 16 having larger cross-sectional areas than the cross-sectional areas of the first portions by way of the nominal diameter of the cross-sectional areas formed by second walls 20 being greater than the nominal diameter of the cross-sectional areas formed by first walls 18. If desired, more than two layers 34,36 may be used. FIG. 8 illustrates material element 28, formed in a similar manner as is depicted in FIGS. 1–4, using the stencil formed of multiple layers 34, 36.

Substrate 14 forming the semiconductor device can be any type of material, such as a silicon wafer, a ceramic base or FR-4 (Flame Retardant level 4) board, which is well known to those skilled in the art. The material 26 can be any type of material that is normally applied to such a surface. This includes glue, polymers, photosensitive resins, or soldering paste.

FIG. 9 depicts a top view of a stencil 12 that includes a plurality of apertures 16. The layout of the plurality of apertures 16 can be of any desired configuration, preferably one complementary to the configuration of the substrate 14.

The use of an aperture 16, having a larger cross-sectional area in contact with the surface of the substrate where material 26 is extruded onto the substrate 14, offers several benefits. One benefit is that greater package reliability is achieved. This is because stresses in the extruded material forming elements 28 are reduced due to the overall height allowing for stresses to spread out, compensating for mismatched coefficient of thermal expansion (CTE) between the substrate 14 and the die that will be attached to substrate 14. Typically, the CTE of the die is less than the CTE of the substrate. Another benefit is that of higher yield. Greater yield is achieved because the material elements 28 more consistently conform to the desired critical dimensions and are protected or untouched in portions of the apertures 16 of the stencil 12. Another benefit is that the stencil 12 can be cleaned more easily, as there is less material left in a portion of the aperture 16. Yet another benefit is that of higher throughput. This is achieved since the stencil 12 has less material 26 remaining therein for cleaning or for redeposition. Additionally, material seepage is greatly reduced, if not entirely eliminated, because the material is extruded without excessive pressure being applied to the stencil to cause the deflection thereof, thereby minimizing the occurrences of bridges or shorts formed from excess material applied to the substrate 14. This not only increases throughput, but also yield. Additionally, since the stencil 12 has less material remaining on it, it can either be cleaned more frequently with less wear or cleaned less often, thus saving a step. Further, less pressure is needed to hold the stencil 12 in place on the substrate 14 since the bottom perimeter of each aperture 16 is more effective in controlling seepage. With this reduced pressure, less wear is placed on the stencil that results in a greater life expectancy.

Those skilled in the art will appreciate that semiconductor devices attached to a surface using the vertical elements according to the present invention may comprise an integrated circuit die employed for storing or processing digital information, including, for example, a Dynamic Random Access Memory (DRAM) integrated circuit device, a Static Random Access Memory (SRAM) integrated circuit device, a Synchronous Graphics Random Access Memory (SGRAM) integrated circuit device, a Programmable Read-Only Memory (PROM) integrated circuit device, an Electrically Erasable PROM (EEPROM) integrated circuit device, a flash memory device and a microprocessor device, and that the present invention includes such devices within its scope.

Figure 10:
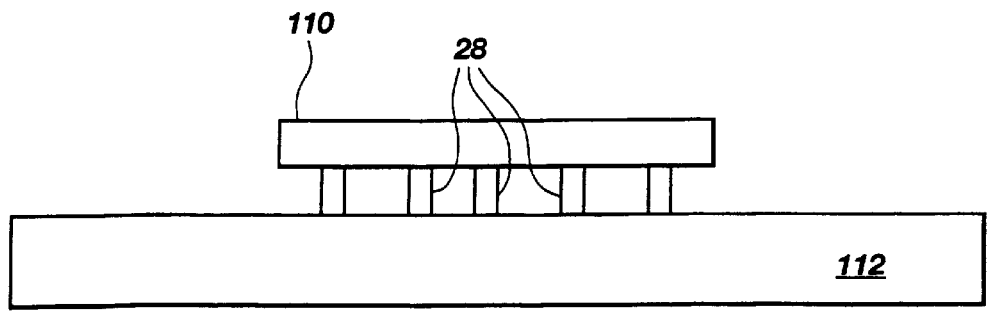
FIG. 10 is a schematic diagram of a semiconductor device attached to a printed circuit board (PCB) according to the present invention.
Figure 11:
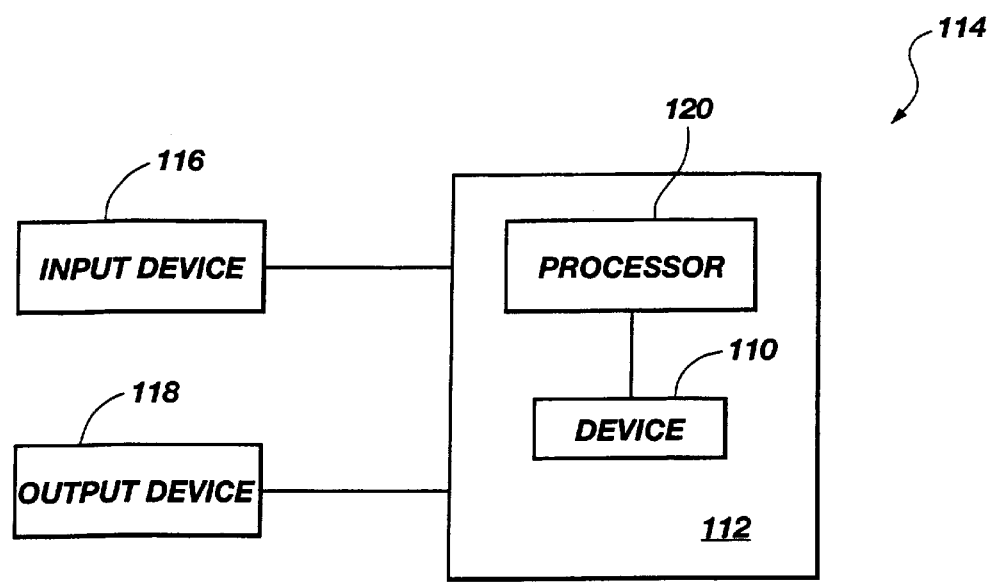
FIG. 11 is a block diagram of a computer system incorporating the PCB of FIG. 10.

As shown in FIG. 10, a semiconductor device 110 is attached to a printed circuit board (PCB) 112 using material elements 28 as fabricated using the manufacturing apparatus 10 of FIGS. 1–8. Once the material elements 28 are applied to the surface of PCB 112, semiconductor device 110 is placed on PCB 112 and the structure is then heated sufficiently so as to affix the material elements 28 to provide a mechanical and electrical bond between PCB 112 and semiconductor device 110. Also, as shown in FIG. 11, an electronic system 114 includes an input device 116 and an output device 118 coupled to a processor device 120 which, in turn, is mounted to PCB 112 having semiconductor device 110. Processor device 120 can be mounted in a like manner as semiconductor device 110.

Although the present invention has been described with reference to a particular embodiment, the invention is not limited to this described embodiment. The invention is limited only by the appended claims, which include within their scope all equivalent devices or methods which operate according to the principles of the invention as described.

What is claimed is:

1. A stencil for applying a solder paste to a wafer, said stencil comprising:
    a stencil having a top surface, a bottom surface, a thickness, and a plurality of apertures passing from said top surface to said bottom surface, at least one aperture of said plurality of apertures including:
        a first portion of said at least one aperture formed by a first wall portion extending generally vertically from said top surface of said stencil into said at least one aperture of said plurality of apertures and having a first nominal diameter defining a first cross-sectional area;
        a second portion of the at least one aperture of the plurality of apertures formed by a second wall portion extending generally vertically from said bottom surface of said stencil into said at least one aperture of said plurality of apertures and having a nominal diameter defining a second cross-sectional area;
        at least one sloped annular shoulder intermediate said first wall portion and said second wall portion of said at least one aperture of said plurality of apertures, said at least one sloped annular shoulder having a preselected shape; and
        said second cross-sectional area in said at least one aperture of said plurality of apertures larger than said first cross-sectional area of said first portion of said at least one aperture of said plurality of apertures such that said solder paste does not contact said second wall portion of said at least one aperture of said plurality of apertures during use of said stencil, said thickness of said stencil ranging from 0.1 to 10 times the first nominal diameter of said at least one aperture of said plurality of apertures adjacent said top surface of said stencil.

2. The stencil according to claim 1, wherein said stencil is made of stainless steel.

3. The stencil according to claim 1, wherein said stencil is made of plastic.

4. The stencil according to claim 1, wherein said preselected shape of said at least one sloped annular shoulder of said at least one aperture of said plurality of apertures comprises said sloped annular shoulder sloped towards said bottom surface of said stencil.

5. The stencil according to claim 1, wherein said at least one sloped annular shoulder slopes from said first portion of said at least one aperture of said plurality of apertures towards said second portion of said at least one aperture of said plurality of apertures.

6. The stencil according to claim 5, wherein said at least one sloped annular shoulder has an acute shape.

7. The stencil according to claim 5, wherein said at least one sloped annular shoulder has an obtuse shape.

8. The stencil according to claim 5, wherein said at least one sloped annular shoulder has an indented shape.

9. A method for forming substantially vertical elements of solder paste on a wafer comprising:

providing a stencil having a plurality of apertures formed therethrough from a top surface of said stencil to a bottom surface of said stencil, aperture of said plurality of apertures including a first portion having a first cross-sectional area formed by a first wall portion having a first nominal diameter and extending generally vertically from said top surface of said stencil, a second portion of said at least one aperture of said plurality of apertures adjacent said bottom surface of said stencil and having a second cross-sectional area formed by a second wall portion having a nominal diameter larger than said first nominal diameter of said first wall portion and extending generally vertically from said bottom surface of said stencil, said stencil having a thickness in the range from 0.1 to 10 times the first nominal diameter of the first wall portion of said at least one aperture of said plurality of apertures, and at least one sloped annular shoulder having a preselected shape located between said first wall portion and said second wall portion of said at least one aperture of said plurality of apertures;

applying said stencil to a surface of said wafer;

extruding a solder material having a viscosity in the range between 30K to 310K centipoise through said plurality of apertures formed in said stencil;

preventing contact of said solder material with said second wall portion of said at least one aperture of said plurality of apertures during said extruding of said solder material by said second cross-sectional area of said second portion of said at least one aperture of said plurality of apertures being larger than said first cross-sectional area of said first portion of said aperture of said plurality of apertures; and removing said stencil and leaving said solder paste in a substantially vertical column.

10. The method according to claim 9, wherein said extruding further comprises:

applying said solder paste to said top surface; and wiping said solder paste across said top surface of said stencil to force said solder paste through said plurality of apertures.

11. The method according to claim 9, wherein said solder paste has a viscosity of approximately 70K centipoise.

12. The method according to claim 9, wherein said solder paste has a thixotropic index ranging between 1.7–3.2.

13. The method according to claim 9, wherein said solder paste has a thixotropic index of approximately 2.5.

14. The method according to claim 9, wherein said stencil is made of stainless steel.

15. The method according to claim 9, wherein said stencil is made of plastic.

16. The method according to claim 9, wherein said at least one sloped annular shoulder slopes from said first portion of said at least one aperture of said plurality of apertures towards said second portion of said at least one aperture of said plurality of apertures.

17. The method according to claim 16, wherein said at least one sloped annular shoulder has an acute shape.

18. The method according to claim 16, wherein said at least one sloped annular shoulder has an obtuse shape.

19. The method according to claim 16, wherein said at least one sloped annular shoulder has an indented shape.

* * * * *

UNITED STATES PATENT AND TRADEMARK OFFICE
CERTIFICATE OF CORRECTION

| | |
|---|---|
| PATENT NO. | : 6,269,742 B1 |
| APPLICATION NO. | : 09/572738 |
| DATED | : August 7, 2001 |
| INVENTOR(S) | : Chad Cobbley and Ford B. Grigg |

It is certified that error appears in the above-identified patent and that said Letters Patent is hereby corrected as shown below:

In the drawings:

FIG. 1, move the lead line extending from reference numeral "18" to indicate the center of the aperture; then change reference numeral "18" to --16-- and change reference numeral "16" to --18-- (as shown below)

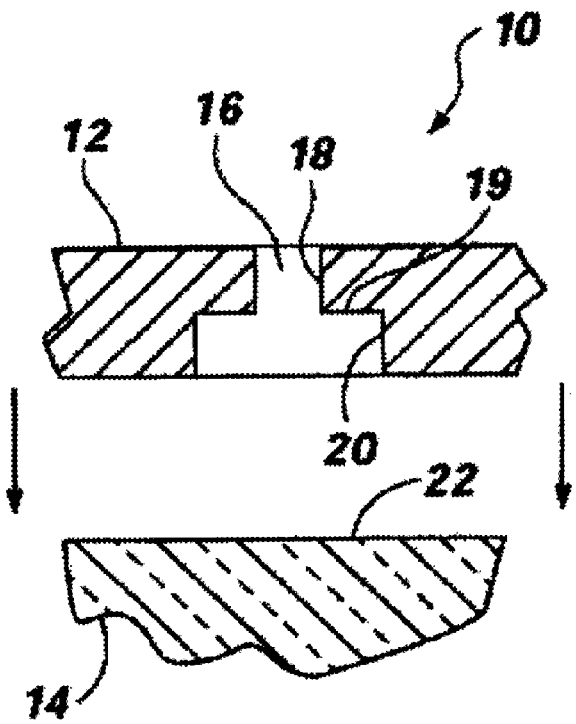

Fig. 1

UNITED STATES PATENT AND TRADEMARK OFFICE
CERTIFICATE OF CORRECTION

PATENT NO. : 6,269,742 B1
APPLICATION NO. : 09/572738
DATED : August 7, 2001
INVENTOR(S) : Chad Cobbley and Ford B. Grigg It is certified that error appears in the above-identified patent and that said Letters Patent is hereby corrected as shown below:

In the specification:
    COLUMN 2,  LINE 27,  change "solder pasted" to --solder paste--
    COLUMN 3,  LINE 58,  change "of material." to --of material 26.--

In the claims:
CLAIM 9, COLUMN 8, LINE 7,  change "said aperture" to --said at least one aperture--

Signed and Sealed this

First Day of January, 2008

JON W. DUDAS
*Director of the United States Patent and Trademark Office*